United States Patent
El-Hinnawy et al.

(10) Patent No.: US 10,978,639 B2
(45) Date of Patent: Apr. 13, 2021

(54) CIRCUITS FOR REDUCING RF SIGNAL INTERFERENCE AND FOR REDUCING DC POWER LOSS IN PHASE-CHANGE MATERIAL (PCM) RF SWITCHES

(71) Applicant: Newport Fab, LLC, Newport Beach, CA (US)

(72) Inventors: Nabil El-Hinnawy, Irvine, CA (US); Jefferson E. Rose, Hawthorne, CA (US); David J. Howard, Irvine, CA (US); Gregory P. Slovin, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 149 days.

(21) Appl. No.: 16/228,061

(22) Filed: Dec. 20, 2018

(65) Prior Publication Data

US 2020/0058850 A1 Feb. 20, 2020

Related U.S. Application Data

(63) Continuation-in-part of application No. 16/103,490, filed on Aug. 14, 2018, now Pat. No. 10,476,001, and
(Continued)

(51) Int. Cl.
*H01L 45/00* (2006.01)
*H01L 27/24* (2006.01)
(Continued)

(52) U.S. Cl.
CPC .......... *H01L 45/06* (2013.01); *G11C 13/0004* (2013.01); *G11C 13/0069* (2013.01);
(Continued)

(58) Field of Classification Search
None
See application file for complete search history.

(56) References Cited

U.S. PATENT DOCUMENTS

5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Bo B Jang
(74) *Attorney, Agent, or Firm* — Farjami & Farjami LLP

(57) ABSTRACT

A circuit according to the present application includes a diode or other non-linear device coupled to a heating element of a phase-change material (PCM) radio frequency (RF) switch. The diode or other non-linear device allows an amorphizing pulse or a crystallizing pulse to pass to a first terminal of the heating element. The diode or other non-linear device substantially prevents a pulse generator providing the amorphizing pulse or crystallizing pulse from interfering with RF signals at RF terminals of the PCM RF switch. In an array of PCM cells each including a diode or other non-linear device, the diode or other non-linear device substantially prevents sneak paths that would otherwise enable an amorphizing or crystallizing pulse intended for a heating element of a selected cell of the array to be provided to heating elements of unselected cells of the array.

20 Claims, 7 Drawing Sheets

Related U.S. Application Data a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/161,960, filed on Oct. 16, 2018, now Pat. No. 10,644,235.

(51) Int. Cl.
  *G11C 13/00* (2006.01)
  *H03K 17/56* (2006.01)

(52) U.S. Cl.
  CPC ...... *H01L 27/2463* (2013.01); *H01L 45/1226* (2013.01); *H01L 45/1286* (2013.01); *H03K 17/56* (2013.01); *G11C 2013/008* (2013.01); *G11C 2013/0092* (2013.01); *H01L 45/143* (2013.01); *H01L 45/144* (2013.01)

(56) References Cited

U.S. PATENT DOCUMENTS

| | | |
|---|---|---|
| 6,535,545 B1 | 3/2003 | Ben-Bassat |
| 6,894,305 B2 | 5/2005 | Yi |
| 7,522,029 B1 | 4/2009 | Lantz |
| 7,920,414 B2 | 4/2011 | Lowrey |
| 8,314,983 B2 | 11/2012 | Frank |
| 8,345,472 B2 | 1/2013 | Lee |
| 2,014,181 A1 | 7/2014 | Moon |
| 9,257,647 B2 | 2/2016 | Borodulin |
| 9,362,492 B2 | 6/2016 | Goktepeli |
| 9,368,720 B1 | 6/2016 | Moon |
| 9,444,430 B1 | 9/2016 | Abdo |
| 9,601,545 B1 | 3/2017 | Tu |
| 9,640,759 B1 | 5/2017 | Curioni |
| 9,891,112 B1 | 2/2018 | Abel |
| 9,917,104 B1 | 3/2018 | Roizin |
| 10,128,243 B2 | 11/2018 | Yoo |
| 10,164,608 B2 | 12/2018 | Belot |
| 10,461,253 B1 | 10/2019 | Slovin |
| 10,505,106 B1 | 12/2019 | Joshi |
| 10,529,922 B1 | 1/2020 | Howard |
| 2004/0113232 A1 | 6/2004 | Johnson et al. |
| 2005/0127348 A1 | 6/2005 | Horak |
| 2005/0212090 A1 | 9/2005 | Friedrich et al. |
| 2006/0246712 A1 | 11/2006 | Kim |
| 2007/0075347 A1 | 4/2007 | Lai |
| 2007/0246766 A1 | 10/2007 | Liu |
| 2007/0247899 A1 | 10/2007 | Gordon |
| 2008/0142775 A1 | 6/2008 | Chen |
| 2008/0142777 A1 | 6/2008 | Park |
| 2008/0272355 A1 | 11/2008 | Cho |
| 2008/0291718 A1 | 11/2008 | Liu |
| 2009/0065761 A1 | 3/2009 | Chen |
| 2009/0108247 A1 | 4/2009 | Takaura |
| 2009/0115052 A1 | 5/2009 | Treece et al. |
| 2010/0008127 A1 | 1/2010 | Muraoka |
| 2010/0084626 A1 | 4/2010 | Delhougne |
| 2010/0163822 A1* | 7/2010 | Ovshinsky ............ H01L 45/04 257/2 |
| 2010/0237314 A1 | 9/2010 | Tsukamoto |
| 2010/0238720 A1 | 9/2010 | Tio Castro |
| 2010/0246247 A1 | 9/2010 | Kim |
| 2011/0002158 A1 | 1/2011 | Muraoka |
| 2011/0097825 A1 | 4/2011 | Cheng |
| 2011/0291784 A1 | 12/2011 | Nakatsuji |
| 2012/0037872 A1 | 2/2012 | Ikarashi |
| 2013/0187120 A1 | 7/2013 | Redaelli |
| 2013/0285000 A1 | 10/2013 | Arai |
| 2014/0110657 A1 | 4/2014 | Redaelli |
| 2014/0191181 A1 | 7/2014 | Moon |
| 2014/0264230 A1 | 9/2014 | Borodulin |
| 2014/0339610 A1 | 11/2014 | Rashed |
| 2015/0048424 A1 | 2/2015 | Tien |
| 2015/0090949 A1 | 4/2015 | Chang |
| 2015/0249096 A1 | 9/2015 | Lupino |
| 2015/0333131 A1 | 11/2015 | Mojumder |
| 2016/0035973 A1 | 2/2016 | Raieszadeh |
| 2016/0056373 A1 | 2/2016 | Goktepeli |
| 2016/0071653 A1 | 3/2016 | Lamorey |
| 2016/0308507 A1 | 10/2016 | Engelen |
| 2017/0092694 A1 | 3/2017 | BrightSky |
| 2017/0126205 A1 | 5/2017 | Lin |
| 2017/0187347 A1 | 6/2017 | Rinaldi |
| 2017/0207764 A1 | 7/2017 | Wang |
| 2017/0243861 A1 | 8/2017 | Wang |
| 2017/0365427 A1 | 12/2017 | Borodulin |
| 2018/0005786 A1 | 1/2018 | Navarro |
| 2018/0122825 A1 | 5/2018 | Lupino |
| 2018/0138894 A1 | 5/2018 | Belot |
| 2018/0194615 A1 | 7/2018 | Nawaz |
| 2018/0266974 A1 | 9/2018 | Khosravani |
| 2018/0269393 A1 | 9/2018 | Zhang |
| 2019/0064555 A1 | 2/2019 | Hosseini |
| 2019/0067572 A1 | 2/2019 | Tsai |
| 2019/0088721 A1 | 3/2019 | Reig |
| 2019/0165264 A1 | 5/2019 | Wu |
| 2019/0172657 A1 | 6/2019 | Zhu |
| 2019/0267214 A1 | 8/2019 | Liu |
| 2019/0296718 A1 | 9/2019 | Birkbeck |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

* cited by examiner

CIRCUITS FOR REDUCING RF SIGNAL INTERFERENCE AND FOR REDUCING DC POWER LOSS IN PHASE-CHANGE MATERIAL (PCM) RF SWITCHES

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/161,960, filed on Oct. 16, 2018, titled "Phase-Change Material (PCM) Radio Frequency (RF) Switch with Reduced Parasitic Capacitance,". The disclosures and contents of all of the above-identified applications are hereby incorporated fully by reference into the present application.

BACKGROUND

Phase-change materials (PCMs) are capable of transforming between an amorphous phase and a crystalline phase. For example, a PCM switch may be transformed from a non-conductive amorphous phase to a highly conductive crystalline phase by a crystallizing pulse applied to the PCM by a pulse generator. The PCM switch may subsequently be transitioned back to the non-conductive amorphous phase by an amorphizing pulse applied to the PCM by the pulse generator. Given the ever-increasing reliance on radio frequency (RF) communication, there is particular need for RF switching devices to exploit the advantages provided by PCM switches.

For optimal performance, it is advantageous for an RF terminal of a PCM RF switch to be as decoupled as possible from a pulse generator providing the crystallizing and amorphizing pulses. Decoupling RF terminals of a PCM RF switch from a pulse generator is important because impedance variations presented by, and/or during operation of, the pulse generator, for example variations in an output impedance of the pulse generator, can result in interference with RF signals at RF terminals of the PCM RF switch, thereby undesirably degrading its performance of the switch.

Moreover, when PCM RF switches are used in an array of switches, there are often various undesirable "sneak paths" where amorphizing or crystallizing pulses generated by a pulse generated undesirably find their way to heating elements of PCM RF switches that are not intended to receive such pulses (i.e. when PCM RF switches are purposely unselected). Thus, there is need in the art to avoid undesirably supplying amorphizing or crystallizing pulses from a pulse generator to a PCM RF switch in an array of switches when a PCM RF switch is not intended to receive the amorphizing or crystallizing pulse.

SUMMARY

The present disclosure is directed to circuits for reducing RF signal interference and for reducing DC power loss in phase-change material (PCM) RF switches, substantially as shown in and/or described in connection with at least one of the figures, and as set forth in the claims.

DETAILED DESCRIPTION

Figure 1A:
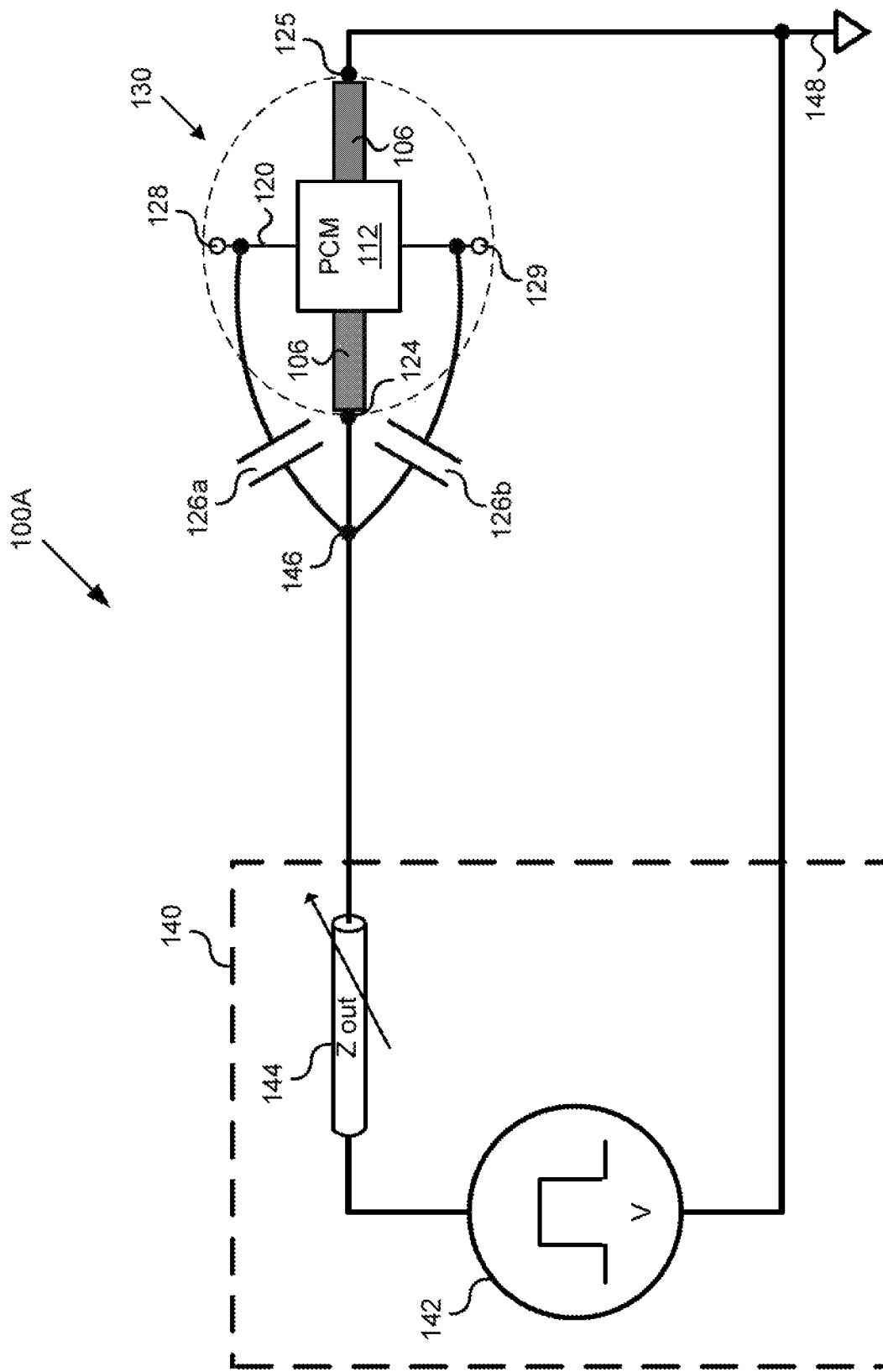
FIG. 1A shows a circuit including a phase-change material PCM RF switch that undesirably allows a pulse generator to interfere with RF signals at RF terminals of the PCM RF switch.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present application is directed to circuits for reducing RF signal interference and for reducing DC power loss in phase-change material (PCM) RF switches. It is noted that, according to the present application, a PCM in the PCM RF switch includes an active segment and passive segments. The active segment of the PCM is that portion of the PCM that undergoes a phase change in response to a crystallizing or an amorphizing pulse and generally lies between electrical contacts on each end of the PCM. The passive segments of the PCM are those portions of the PCM that are generally not subject to a crystallizing or an amorphizing pulse and do not undergo a phase change.

A crystallizing pulse that holds the active segment of the PCM at or above a crystallization temperature for a sufficient amount of time will transform the PCM into the crystalline phase. Accordingly, such a pulse may be referred to simply as a "crystallizing pulse" in the present application. The crystallization temperature depends on the PCM. In one implementation, the crystallization temperature can be approximately two hundred degrees Celsius (200° C.), for example.

The amount of time needed to transform the active segment of the PCM into the crystalline phase depends on the material, dimensions, temperature, and thermal conductivity of the PCM and its neighboring structures. In one implementation, the time required can be approximately one microsecond (1.0 µs), for example, but may be greater or less than 1.0 µs. Transformation of the active segment of the PCM to a crystalline phase significantly reduces the electrical resistivity of the PCM. For example, in various implementations, the electrical resistance of the PCM when in the amorphous phase can range from approximately ten kilo-Ohms to approximately one mega-Ohm (10 kΩ-1MΩ). By contrast, the electrical resistance of the PCM when in the crystalline phase can be approximately one Ohm (1Ω).

An amorphizing pulse that melts and rapidly quenches the active segment of the PCM from a temperature at or above the melting temperature of the PCM will transform the active segment of the PCM into the amorphous phase. Accordingly, such a pulse may be referred to simply as an "amorphizing pulse" in the present application. The melting temperature depends on the PCM. In one implementation, the melting temperature can be approximately seven hundred degrees Celsius (700° C.). How rapidly the PCM must be quenched in order to transform the active segment of the PCM into the amorphous phase depends on the material, dimensions, temperature, and thermal conductivity of the PCM and its surrounding structures. In one implementation, the time required can be approximately one hundred nanoseconds (100 ns), for example, but may be greater or less than 100 ns).

FIG. 1A shows a circuit including a phase-change material PCM RF switch that undesirably allows a pulse generator to interfere with RF signals at RF terminals of the PCM RF switch. As shown in FIG. 1A, circuit 100A includes pulse generator 140 for providing crystallizing and/or amorphizing pulses used to program PCM RF switch 130. Pulse generator 140 includes voltage source 142 and has variable output impedance 144. It is noted that variable output impedance 144 is the impedance seen by PCM RF switch 130 as PCM RF switch looks into pulse generator 140 from node 146.

PCM RF switch 130 includes PCM 112, heating element 106 having first terminal 124 and second terminal 125, and RF signal line 120 having RF terminals 128 and 129. Also shown in FIG. 1A are parasitic capacitors 126a and 126b coupling RF terminals 128 and 129 of PCM RF switch 130 to variable output impedance 144 of pulse generator 140. Also shown in FIG. 1A is DC ground 148 of circuit 100A.

As further shown in FIG. 1A, heating element 106 of PCM RF switch 130 is coupled between pulse generator 140 and DC ground 148. That is to say, first terminal 124 of heating element 106 is coupled to the output of pulse generator 140, while second terminal 125 of heating element 106 is coupled to DC ground 148. As noted above, pulse generator 140 provides a crystallizing or amorphizing pulse used to program PCM RF switch 130, such as a voltage pulse for example. Such a pulse is output by pulse generator 140 to first terminal 124 of heating element 106 and produces a corresponding heat pulse in heating element 106 causing PCM 112 to be selectively transformed from an amorphous phase to a crystalline phase, or vice versa.

Because it is desirable for the power output by pulse generator 140 to be used for heating by heating element 106, it is desirable for output impedance 144 of pulse generator 140 to be small. However, when output impedance 144 is small, parasitic capacitors 126a and 126b can result in pulse generator 140 interfering with RF signals carried by RF signal line 120 and RF terminals 128 and 129 of PCM RF switch 130 due to the relatively small output impedance 144. Moreover, because output impedance 144 of pulse generator 140 presents a variable impedance that may change, for example due to design variations, parasitic capacitors 126a and 126b coupling variable output impedance 144 to RF signal line 120 and RF terminals 128 and 129 can result in further interference with RF signals carried by RF signal line 120 and RF terminals 128 and 129, thereby undesirably degrading the performance PCM RF switch 130.

Figure 1B:
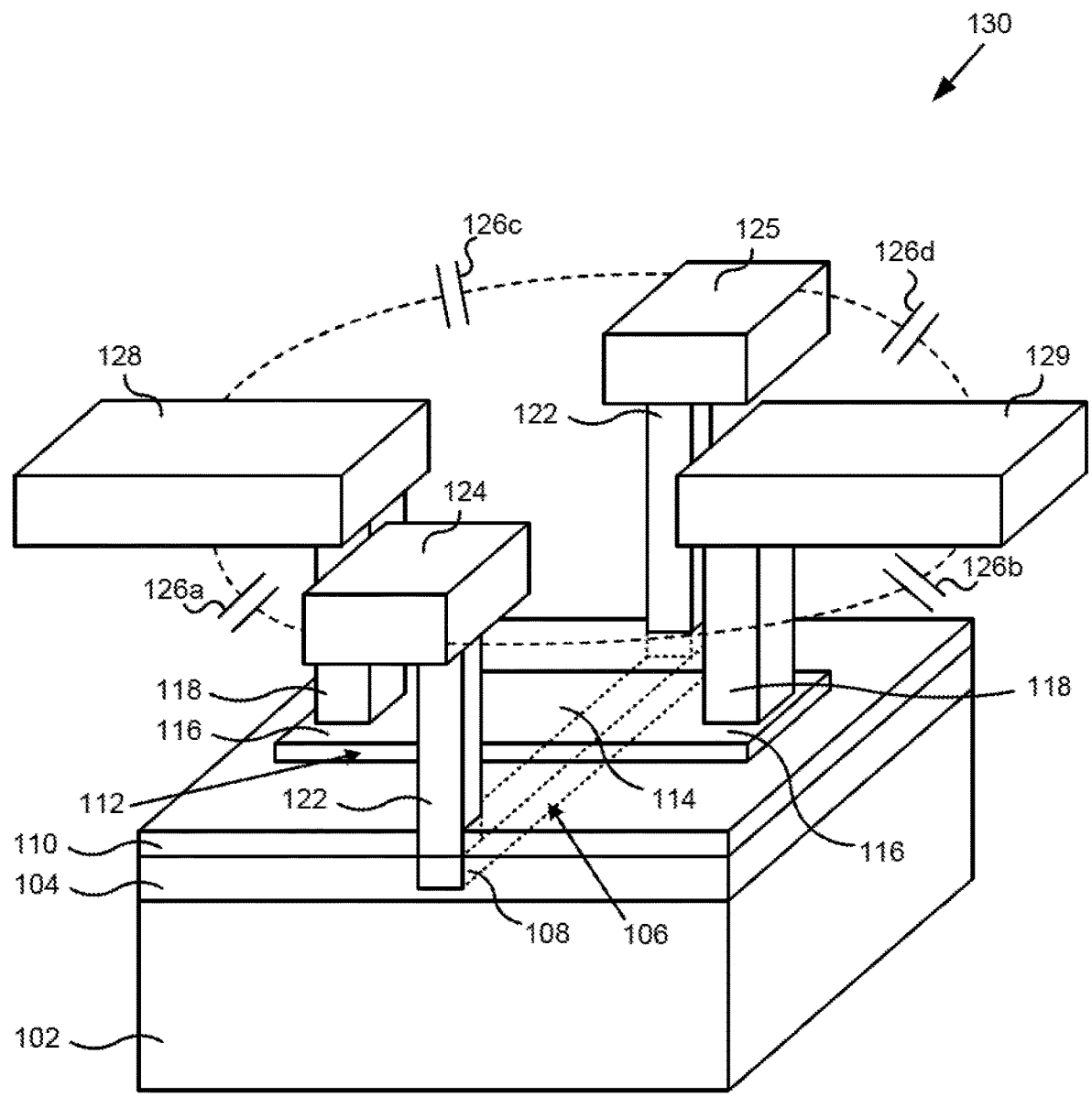
FIG. 1B illustrates a perspective view of a portion of a PCM RF switch according to one implementation of the present application.

FIG. 1B illustrates a perspective view of a portion of PCM RF switch 130 according to one implementation of the present application. It is noted that, for purposes of illustration, the perspective view in FIG. 1B depicts selected structures of PCM RF switch 130. However, PCM RF switch 130 may include other structures not shown in FIG. 1B. It is further noted that features identified in FIG. 1B by reference numbers identical to those appearing in FIG. 1A correspond respectively to those previously identified features and may share any of the characteristics attributed to those features by reference to FIG. 1A above, or below by reference to FIG. 1B.

As shown in FIG. 1B, PCM RF switch 130 includes back-end-of-line multi-level metallization (BEOL MLM) 102, lower dielectric 104, heating element 106 having end portions 108, thermally conductive and electrically insulating material 110, PCM 112 having active segment 114 and passive segments 116. PCM contacts 118, RF terminals 128 and 129, heating element contacts 122, first terminal 124 and second terminal 125 of heating element 106, and parasitic capacitors 126a, 126b, 126c, and 126d.

BEOL MLM 102 is generally any multi-layer stack of interconnect metals and interlayer dielectrics suitable for semiconductor devices. BEOL MLM 102 can comprise a plurality of interconnect metal levels and interlayer dielectric layers. BEOL MLM 102 can also comprise a plurality of devices, such as integrated passive devices (not shown in FIG. 1B), and/or an underlying substrate (not shown in FIG. 1B). In one implementation, a heat spreader (not shown in FIG. 1B) is integrated with BEOL MLM 102 or integrated with an underlying substrate. The heat spreader can comprise any material with high thermal conductivity. In one implementation, the heat spreader can comprise a material with both high thermal conductivity and high electrical resistivity. In various implementations, the heat spreader can comprise silicon (Si), aluminum nitride (AlN), aluminum oxide ($Al_xO_y$), beryllium oxide ($Be_xO_y$), silicon carbide (SiC), diamond, or diamond-like carbon.

Lower dielectric 104 in PCM RF switch 130 is situated on top of BEOL MLM 102. As shown in FIG. 1B, lower dielectric 104 is also adjacent to sides of heating element 106. Lower dielectric 104 may comprise a material with thermal conductivity lower than that of thermally conductive and electrically insulating material 110. In various implementations, lower dielectric 104 can comprise silicon oxide ($SiO_2$,) silicon nitride (SiN), or another dielectric. In various implementations, lower dielectric 104 can have a relative thickness greater or less than shown in FIG. 1B.

Heating element 106 in PCM RF switch 130 is situated in lower dielectric 104. Heating element 106 also underlies PCM 112. Heating element 106 generates a heat pulse in response to a crystallizing pulse or an amorphizing pulse provided by pulse generator 140, in FIG. 1A, for transforming active segment 114 of PCM 112. Heating element 106 can comprise any material capable of Joule heating. Preferably, heating element 106 comprises a material that exhibits minimal electromigration or substantially no electromigration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Thermally conductive and electrically insulating material 110 in PCM RF switch 130 is situated over heating element 106 and lower dielectric 104, and under PCM 112 and, in particular, under active segment 114 of PCM 112. Thermally conductive and electrically insulating material 110 ensures efficient heat transfer between heating element 106 and active segment 114 of PCM 112, while impeding electrical signals from leaking out from the path between PCM contacts 118 to heating element 106 or to other neighboring structures. Thermally conductive and electrically insulating material 110 can comprise any material with high thermal conductivity and high electrical resistivity. In various implementations, thermally conductive and electrically insulating material 110 can comprise aluminum nitride (AlN), aluminum oxide ($Al_XO_Y$), beryllium oxide ($Be_XO_Y$), silicon carbide (SiC), diamond, or diamond-like carbon.

PCM 112 in PCM RF switch 130 is situated over thermally conductive and electrically insulating material 110. PCM 112 includes active segment 114 and passive segments 116. Active segment 114 of PCM 112 approximately overlies heating element 106. Passive segments 118 of PCM 112 extend outward and are transverse to heating element 106, and are situated approximately under PCM contacts 118. That is to say, PCM 112 including active segment 114 and passive segments 116 overlies and is transverse to heating element 106.

As noted above, as used in the present application, "active segment" refers to a segment of PCM that transforms between crystalline and amorphous phases, for example, in response to a crystallizing or an amorphizing pulse, whereas "passive segment" refers to a segment of PCM that does not make such transformation and maintains a crystalline phase (i.e., maintains a conductive state). With proper heat pulses and heat dissipation, active segment 114 of PCM 112 can transform between crystalline and amorphous phases, allowing PCM RF switch 130 to switch between ON and OFF states respectively.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1B, heating element 106 extends outwards and is transverse to PCM 112. Heating element 106 is illustrated with dashed lines as seen through various structures of PCM RF switch 130. Current flowing in heating element 106 flows substantially under active segment 114 of PCM 112.

PCM contacts 118 in PCM RF switch 130 are connected to passive segments 116 of PCM 112. Similarly, heating element contacts 122 are collected to end segments 108 of heating element 106. A described below, PCM contacts 118 and heating element contacts 122 extend through various interlayer metal levels (not shown in FIG. 1B). In various implementations, PCM contacts 118 and heating element contacts 122 can comprise tungsten (W), copper (Cu), or aluminum (Al). In one implementation, PCM contacts 118 and heating element contacts 122 can each comprise a single metal segment in the lowest interlayer metal level. In another implementation, PCM contacts 118 and heating element contacts 122 can each comprise a plurality of intermediate metal segments comprising different interlayer metal levels as well as segments in the lowest interlayer metal level.

RF terminals 128 and 129 (shown in both FIGS. 1A and 1B) in PCM RF switch 130 are connected to PCM contacts 118. Thus, RF terminals 128 and 129 are coupled to PCM contacts 118 that are electrically connected to opposing sides of PCM 112. Moreover, first and second terminals 124 and 125 of heating element 106 are connected to heating element contacts 122. RF terminals 128 and 129 route RF signals from/to an external connection to/from PCM 112 through PCM contacts 118. First terminal 124 and second terminal 125 of heating element 106 route electrical DC pulses from pulse generator 140 (shown in FIG. 1A), through heating element 106, to DC ground 148 (also shown in FIG. 1A) via heating element contacts 122.

As shown in FIG. 1B, in the present implementation, RF terminals 128 and 129, and first and second terminals 124 and 125 of heating element 106 are situated at the same interlayer metal level. In other words, RF terminals 128 and 129, and first and second terminals 124 and 125 of heating element 106 may connect to respective metal segments that are situated in the same interlayer metal level. However, in alternative implementations, RF terminals 128 and 129, and first and second terminals 124 and 125 of heating element 106 may be situated at different interlayer metal levels. In various implementations, RF terminals 128 and 129, and first and second terminals 124 and 125 of heating element 106 can comprise Cu or Al. In one implementation. RF terminals 128 and 129, and first and second terminals 124 and 125 of heating element 106 can be patterned using the same mask in order to simplify manufacturing. The dimensions of RF terminals 128 and 129, and first and second terminals 124 and 125 of heating element 106 can be significantly larger than the dimensions of PCM contacts 118 and heating element contacts 122, in order to more easily establish external connections and to improve signal handling.

Although PCM RF switch 130 can simplify manufacturing, more easily establish external connection, and improve signal handling, notably, parasitic capacitors 126a. 126b, 126c, and 126d are produced. Parasitic capacitors 126a, 126b, 126c, and 126d, illustrated in FIG. 1B, are formed between RF terminals 128 and 129 and first and second terminals 124 and 125 of heating element 106, and/or between PCM contacts 118 and heating element contacts 122. Of particular concern for the purposes of the present application is that PCM RF switch 130 includes parasitic capacitors 126a and 126b coupling RF terminals 128 and 129 to first terminal 124 of heating element 106. As a result, parasitic capacitors 126a and 126b can couple circuit 100A, in FIG. 1A, to RF signal line 120 shown in that figure, thereby undesirably enabling variable output impedance 144 of pulse generator 140 to interfere with the signal handling performance of PCM RF switch 130.

Figure 1C:
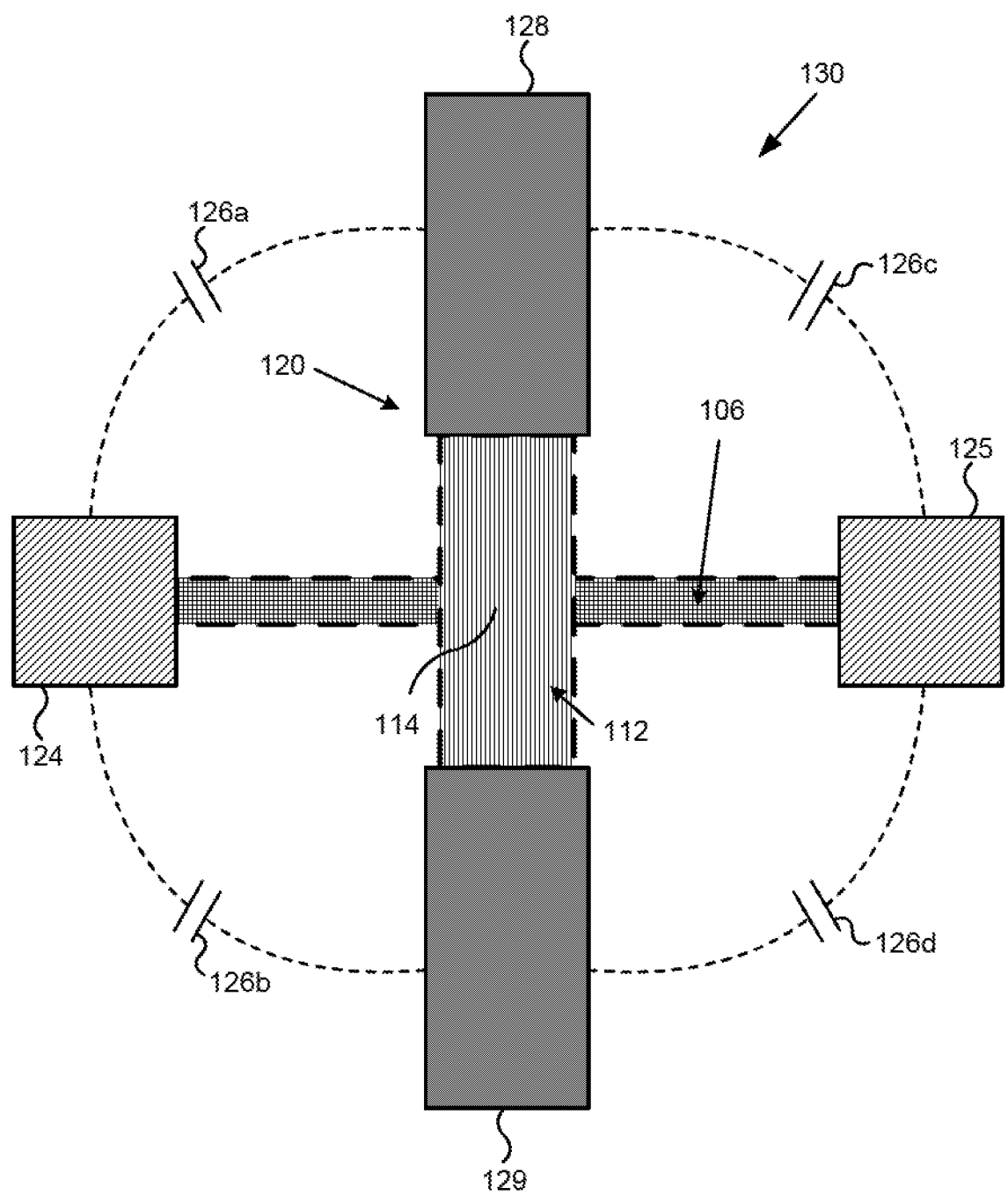
FIG. 1C illustrates a top view of a portion of PCM RF switch of FIGS. 1A and 1B, according to one implementation of the present application.

FIG. 1C illustrates a top view of a portion of PCM RF switch 130 of FIGS. 1A and 1B, except that only selected structures are shown. It is noted that features identified in FIG. 1C by reference numbers identical to those appearing in FIGS. 1A and/or 1B correspond respectively to those previously identified features and may share any of the characteristics attributed to those features by reference to FIGS. 1A and 1B above, or below by reference to FIG. 1C.

As shown in FIG. 1C, first and second terminals 124 and 125 of heating element 106 are formed cross-wise to RF terminals 128 and 129. As used herein, "cross-wise" refers to the fact that, as seen from the top view of FIG. 1C, RF terminals 128 and 129 are not situated in the same row or in the same column as first and second terminals 124 and 125 of heating element 106. Likewise, PCM contacts 118 (shown in FIG. 1B) situated below RF terminals 128 and 129 are formed cross-wise to heating element contacts 122 (also shown in FIG. 1B) situated below first and second terminals 124 and 125 of heating element 106.

PCM 112 and heating element 106, which underlies active segment 114 of PCM 112, are illustrated with dashed lines in FIG. 1C to illustrate that they are seen through various structures of PCM RF switch 130. In contrast, RF terminals 128 and 129 and first and second terminals 124 and 125 of heating element 106 are situated at the same interlayer metal level. As noted above, parasitic capacitors 126a, 126b, 126c, and 126d, illustrated in FIGS. 1B and 1C, are formed between RF terminals 128 and 129 and first and second terminals 124 and 125 of heating element 106, and/or between PCM contacts 118 and heating element contacts 122. As also noted above, parasitic capacitors 126a and 126b can couple circuit 100A, in FIG. 1A, to RF signal line 120 and RF terminals 128 and 129 in that figure, thereby undesirably enabling variable output impedance 144 of pulse generator 140 to interfere with the signal handling performance of PCM RF switch 130.

Figure 1D:
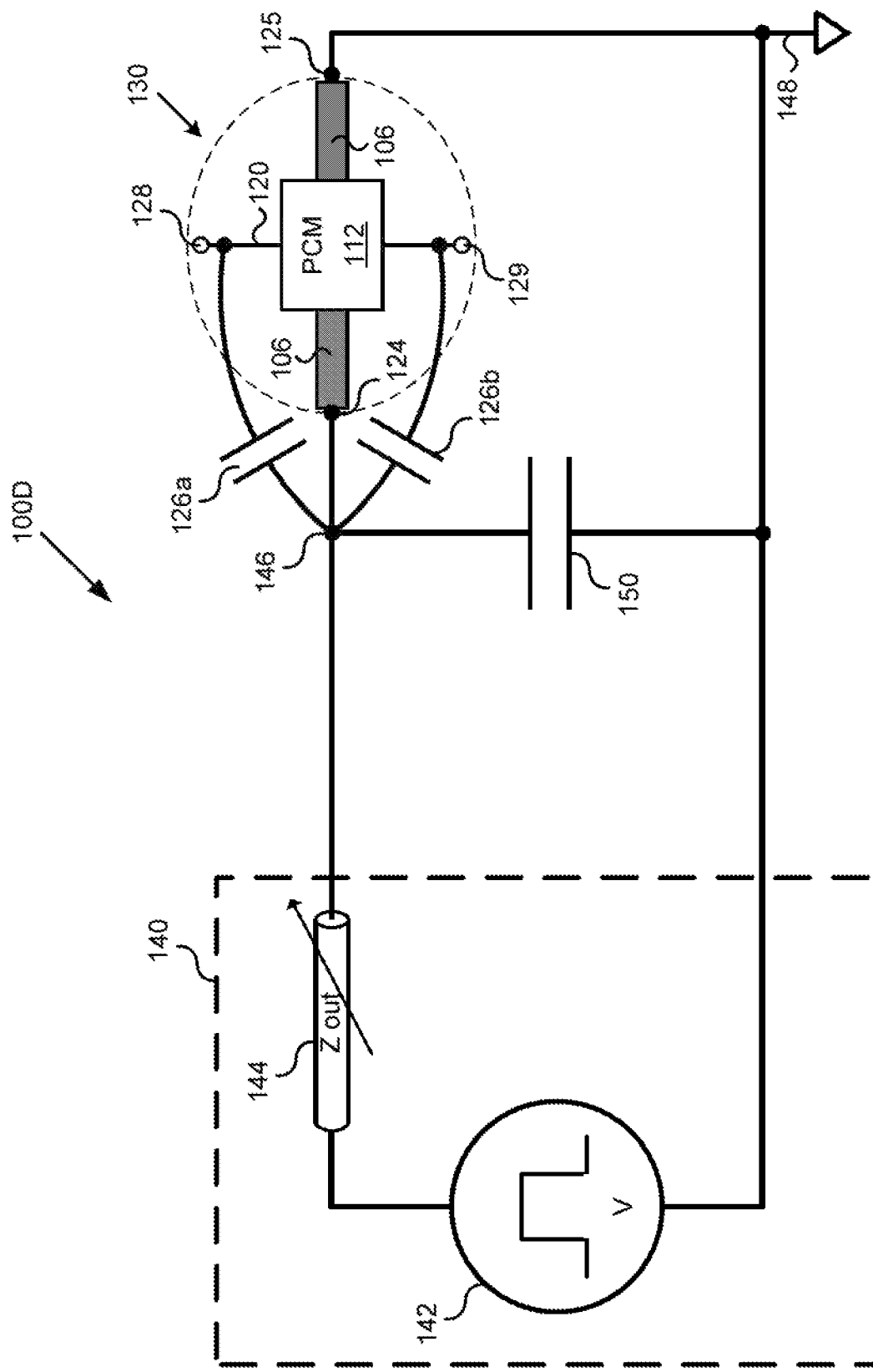
FIG. 1D shows one solution for addressing the parasitic capacitive coupling and the resulting interference from a pulse generator to the RF terminals of the PCM RF switch.

FIG. 1D shows one solution for addressing the parasitic capacitive coupling and the resulting interference from variable output impedance 144 of pulse generator 140 in FIG. 1A to RF signal line 120 and RF terminals 128 and 129 of PCM RF switch 130. It is noted that features in FIG. 1D identified by reference numbers identical to those appearing in FIGS. 1A, 1B, and 1C correspond respectively to those previously identified features and may share any of the characteristics attributed to those features by reference to FIGS. 1A, 1B, and 1C, above.

As shown in FIG. 1D, circuit 100D includes pulse generator 140 for providing the crystallizing and/or amorphizing pulses used to program PCM RF switch 130. Pulse generator 140 includes voltage source 142 and has variable output impedance 144. As discussed above, PCM RF switch 130 includes PCM 112, heating element 106 having first terminal 124 and second terminal 125, and RF signal line 120 having RF terminals 128 and 129. In addition, FIG. 1D shows parasitic capacitors 126a and 126b coupling RF signal line 120 of PCM RF switch 130 to variable output impedance 144 of pulse generator 140, as well as DC ground 148 of circuit 100D.

As discussed above by reference to FIG. 1A, because output impedance 144 of pulse generator 140 presents a variable and unpredictable impedance, parasitic capacitors 126a and 126b coupling variable output impedance 144 to RF terminals 128 and 129 can result in an undesirable interference with RF signals carried by RF terminals 128 and 129 of PCM RF switch 130, thereby undesirably degrading the performance PCM RF switch 130. The solution shown in FIG. 1D addresses that problem in the art by coupling shunt capacitor 150 between node 146 connected to the output of pulse generator 140 and DC ground 148.

In this solution, shunt capacitor 150 is selected to have a large capacitance relative to parasitic capacitors 126a and 126b. In effect, shunt capacitor presents a low impedance RF path to ground 148 at node 146 of circuit 100D. As a result of the coupling of shunt capacitor 150 between node 146 and ground 148, PCM RF switch 130 advantageously experiences a stable impedance at node 146, rather than variable output impedance 144. However, the presence of a low impedance RF path to ground 148 at node 146, can cause RF signals arriving at RF terminal 128 or 129 to be at least partially diverted to ground through parasitic capacitors 126a and/or 126b, and shunt capacitor 150, thereby increasing the insertion loss of PCM RF switch 130, especially at higher frequencies. Consequently, and despite substantially isolating PCM RF switch 130 from variable output impedance 144 of pulse generator 140, the solution represented by shunt capacitor 150 in FIG. 1D undesirably results in significant attenuation of the RF signals carried by RF signal line 120 and terminals 128 and 129 of PCM RF switch 130.

Figure 2:
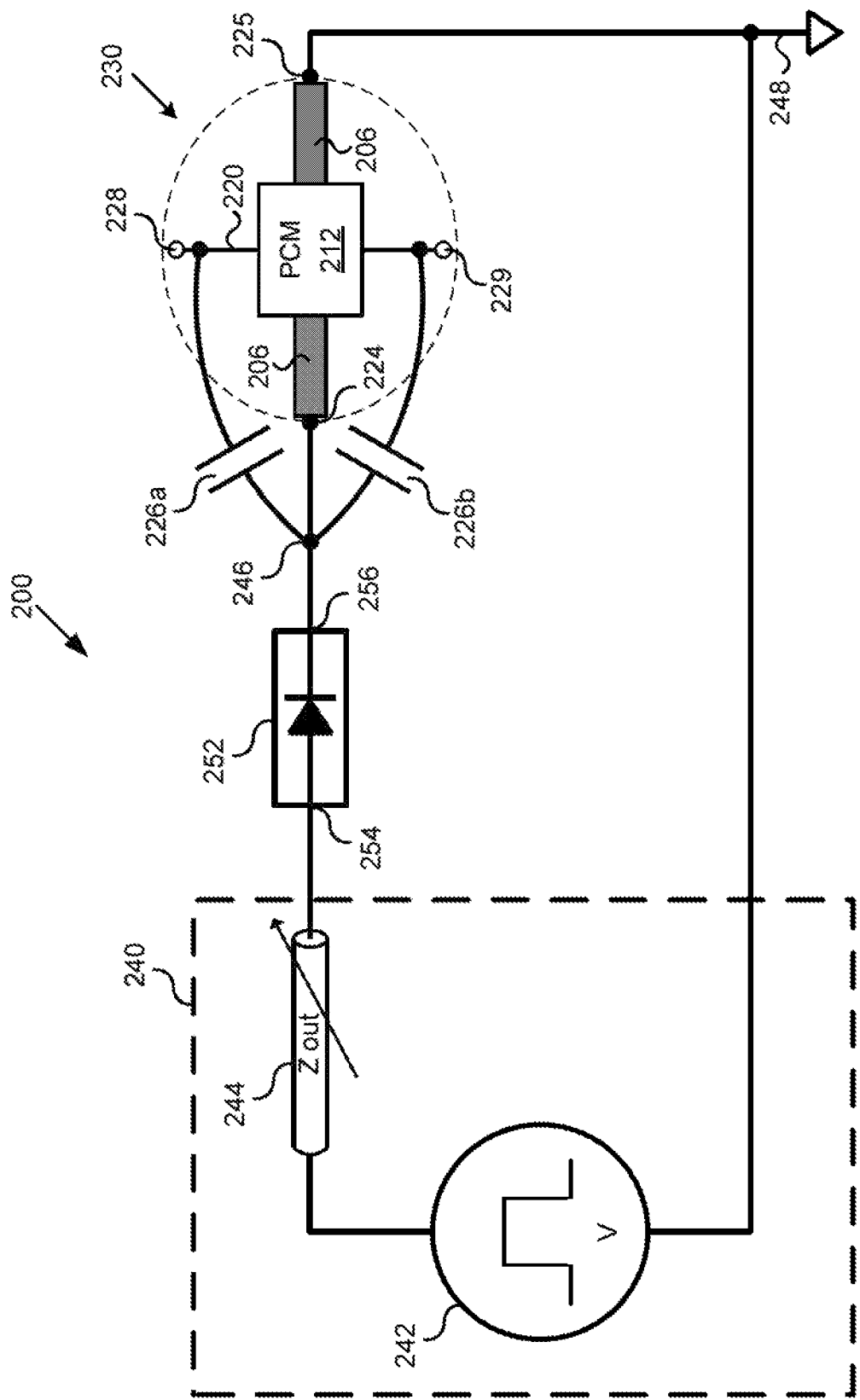
FIG. 2 shows a circuit, including a PCM RF switch for isolating RF terminals and RF signal line of the PCM RF switch from a pulse generator, according to one implementation of the present application.

FIG. 2 shows circuit 200, including a PCM RF switch, that substantially isolates RF terminals and RF signal line of the PCM RF switch from pulse generator 240 of circuit 200, according to one implementation of the present application. As shown in FIG. 2, circuit 200 includes pulse generator 240 for providing the crystallizing and/or amorphizing pulses used to program PCM RF switch 230. Pulse generator 240 includes voltage source 242 and has variable output impedance 244 that drives anode 254 of diode 252, which is an example of a nonlinear device suitable for use in the present implementation. PCM RF switch 230 includes PCM 212, heating element 206 having first terminal 224 and second terminal 225, and RF signal line 220 having RF terminals 228 and 229. In addition, FIG. 2 shows parasitic capacitors 226a and 226b coupling RF terminals 228 and 229 of PCM RF switch 230 to first terminal 224 of heating element 206 as well as to cathode 256 of diode 252 at node 246.

PCM RF switch 230 corresponds in general to PCM RF switch 130, in FIGS. 1A, 1B, and 1C, and may share any of the characteristics attributed to that corresponding feature above. That is to say, although not shown in FIG. 2, PCM RF switch 230 may include any of the features shown by FIGS. 1B and 1C, and described by reference to those figures above. Thus, as in FIG. 1B, PCM 212 of PCM RF switch 230 overlies and is transverse to heating element 206. In addition, and also as in FIG. 1B, RF terminals 228 and 229 are coupled to PCM contacts 118 that are in turn electrically connected to opposing sides of PCM 212.

According to the implementation shown in FIG. 2, heating element 206 of PCM RF switch 230 is coupled between non-linear device 252 (in this example, diode 252) and DC ground 248. That is to say, first terminal 224 of heating element 206 is coupled to the output of non-linear device 252, while second terminal 225 of heating element 206 is coupled to DC ground 248. As noted above, pulse generator 240 provides a crystallizing or amorphizing pulse used to program PCM RF switch 230, such as a voltage pulse for example. Such a pulse is output by pulse generator 240 to first terminal 224 of heating element 206 via non-linear device 252 (in this example, diode 252) and produces a corresponding heat pulse in heating element 206 causing PCM 212 to be selectively transformed from a crystalline phase to an amorphous phase, or vice versa.

As discussed above, absent the novel approach provided in the present application, output impedance 244 of pulse generator 240 presents a variable and unpredictable impedance that interferes with RF signals carried by RF terminals 228 and 229, where such interference is enabled by the undesirable coupling of RF terminals 228 and 229 to variable output impedance 244 through parasitic capacitors 226a and 226b of PCM RF switch 230.

The present novel and inventive solution shown in FIG. 2 provides a solution by using non-linear device 252 between output impedance 244 of pulse generator 240 and first terminal 224 of heating element 206. In one implementation, as shown in FIG. 2, non-linear device 252 may take the form of diode 252 having anode 254 coupled to pulse generator 240 and having cathode 256 coupled to first terminal 224 of heating element 206. However, it is noted that non-linear device 252 may be implemented using other circuit elements having non-linear current-voltage (I-V) characteristics. For example, in other implementations, non-linear device 252 may be implemented using a diode-configured transistor, an ovonic threshold switching device, or a resistive memory element, to name a few alternatives.

In the present example, diode 252 is coupled to first terminal 224 of heating element 206 and allows an amorphizing or a crystallizing pulse provided by pulse generator 240 to pass to first terminal 224 by providing a low impedance path for the amorphizing or crystallizing pulse from pulse generator 240 to heating element 206. Moreover, diode 252 concurrently prevents pulse generator 240 from interfering with RF signals at RF terminals 228 and 229 of PCM RF switch 230. For example, diode 252 substantially prevents RF current from flowing through parasitic capacitors 226a and/or 226b to pulse generator 240. Thus, the otherwise adverse effect of variable output impedance 244 on RF signals at RF terminals 228 and 229 is alleviated since the previous RF path existing between parasitic capacitors 226a and 226b of PCM RF switch 230 and output impedance 244 has now been disabled due to the existence of diode 252.

As a result of the coupling of diode 252 (or in general, non-linear device 252) between pulse generator 240 and first terminal 224 of heating element 206, PCM RF switch 230 advantageously sees a large and stable output impedance looking into anode 256 of diode 252, rather than variable and small output impedance 244 of pulse generator 240. Thus, coupling non-linear device 252 (in this example, diode 252) between pulse generator 240 and first terminal 224 of heating element 206 advantageously isolates PCM RF switch 230 from variable output impedance 244 of pulse generator 240, while also preventing substantially any portion of RF signals received by RF terminals 228 or 229 from being shunted away from RF signal line 220, as was the case when shunt capacitor 150 was present (FIG. 1D). Consequently, circuit 200 advantageously reduces interference otherwise caused by pulse generator 240 in RF signals at terminals 228 and 229 of PCM RF switch 230, thereby significantly improving the performance of PCM RF switch 230.

Figure 3:
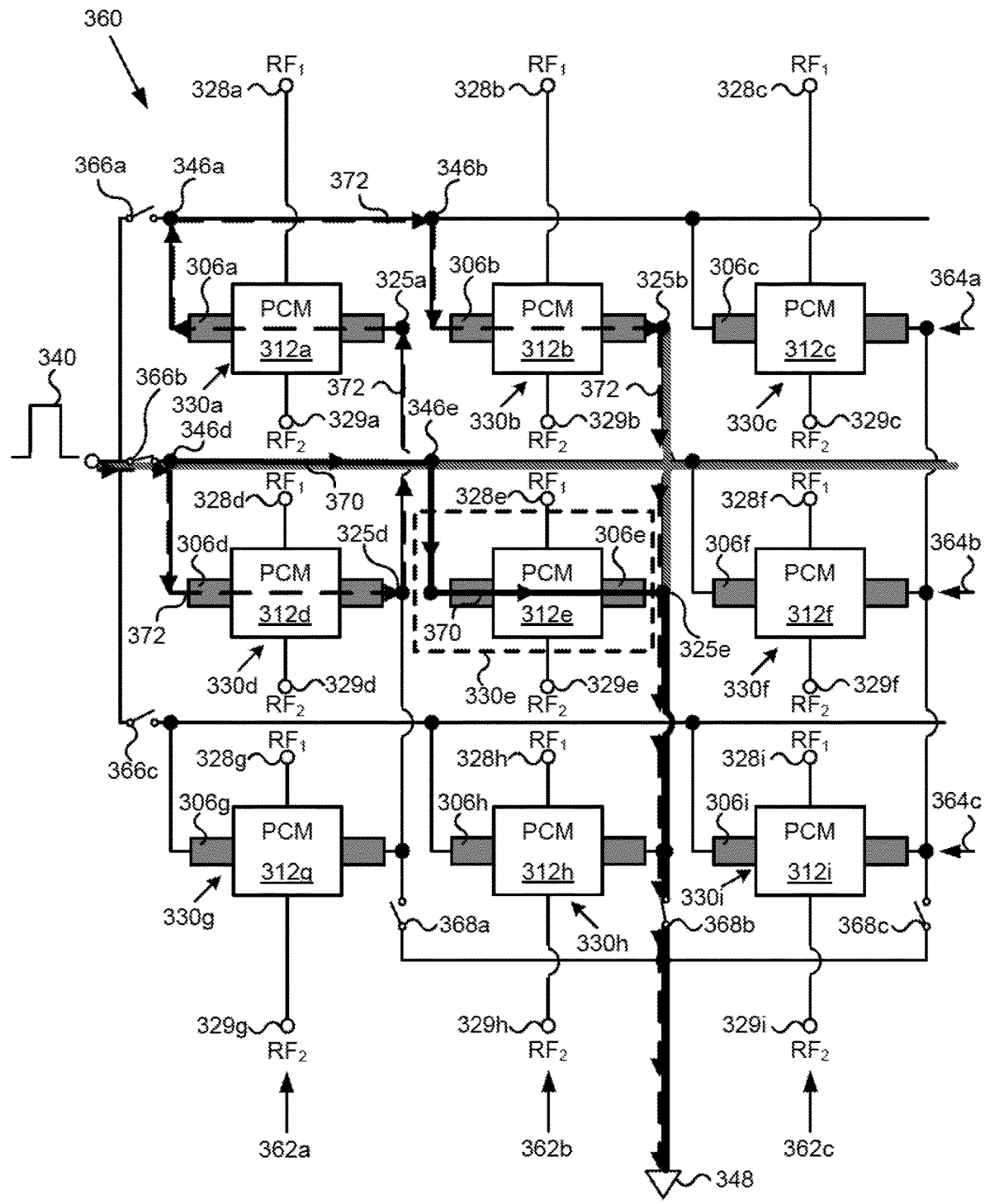
FIG. 3 shows an array of PCM switching cells that provides sneak paths resulting in an amorphizing or crystallizing pulse intended for a selected cell of the array being undesirably provided to unselected cells of the array.

FIG. 3 shows array 360 of PCM switching cells that provides sneak paths resulting in an amorphizing or crystallizing pulse intended for a selected cell of array 360 being undesirably provided to unselected cells of array 360. As shown in FIG. 3, array 360 includes multiple columns 362a, 362b, and 362c, and multiple rows 364a, 364b, and 364c of cells 330a, 330b, 330c, 330d, 330e, 330f, 330g, 330h, and 330i (hereinafter "cells 330a-330i").

As further shown in FIG. 3, each of cells 330a-330i includes a PCM configured to be programmed by amorphizing pulse or crystallizing pulse 340, and further includes a corresponding heating element. As examples, cell 330a includes PCM 312a and heating element 306a, cell 330b includes PCM 312b and heating element 306b, cell 330c includes PCM 312c and heating element 306c, and so forth. In addition, each of cells 330a-330i includes a respective pair of RF terminals. That is to say, cell 330a has RF terminals 328a and 329a, cell 330b has RF terminals 328b and 329b, cell 330c has RF terminals 328c and 329c, and so forth.

FIG. 3 further shows row switches 366a, 366b, and 366c for providing amorphizing or crystallizing pulse 340 to a selected cell of array 360, as well as ground connection switches 368a, 368b, and 368c for coupling the selected cell to DC ground 348. Also shown in FIG. 3 are nodes 346a, 346b, 346d, and 346e of array 360, second terminals 325a, 325b, 325d, and 325e of respective heating elements 306a, 306b, 306d, and 306e, intended path 370 for amorphizing or crystallizing pulse 340, and sneak path 372 for amorphizing or crystallizing pulse 340.

According to the exemplary implementation shown in FIG. 3, each of cells 330a-330i corresponds in general to PCM RF switch 130/230 in FIGS. 1A, 1B, 1C, and 2, and may share any of the characteristics attributed to their corresponding features above. That is to say, although not shown in FIG. 3, each of cells 330a-330i may include any of the features shown by FIGS. 1B and 1C, and described by reference to those figures above. Thus, as in Figure B, PCM 312a of cell 330a overlies and is transverse to heating element 306a. PCM 312b of cell 330b overlies and is transverse to heating element 306b, PCM 312c of cell 330c overlies and is transverse to heating element 306c, and so forth. In addition, and also as in FIG. 1B, RF terminals 328a and 329a are coupled to PCM contacts 118 that are in turn electrically connected to opposing sides of PCM 312a, RF terminals 328b and 329b are coupled to PCM contacts 118 that are electrically connected to opposing sides of PCM 312b, RF terminals 328c and 329c are coupled to PCM contacts 118 that are electrically connected to opposing sides of PCM 312c, and so forth.

It is further noted that cell 330e is framed by a dashed line to indicate that cell 330e including PCM 312e, heating element 306e, and RF terminals 328e and 329e is the cell of array 360 selected to receive amorphizing or crystallizing pulse 340. It is also noted that although FIG. 3 shows array 360 to include three columns and three rows providing nine cells, that representation is provided merely to preserve focus on and for ease of discussion of the present inventive concepts. In other implementations, array 360 may include more or many more than three rows and three columns, and may have many more than nine cells.

In the exemplary implementation shown in FIG. 3, row switch 366b and ground connection switch 368b are closed, while row switches 366a, 366c, and ground connection switches 368a and 368c are open. As a result, intended path 370 for amorphizing or crystallizing pulse 340 is through row switch 366b, through node 346e into the first terminal of heating element 306e, out of grounded second terminal 325e of heating element 306e, and through ground connection switch 368b to ground 348. However, because the second terminals of the respective heating elements of cells 330d and 330a are floating by virtue of ground connection switch 368a being open, a number of possible sneak paths are available for partial diversion of amorphizing or crystallizing pulse 340.

One such possible sneak path is shown as sneak path 372. As shown in FIG. 3, partially diverted amorphizing or crystallizing pulse 340 may follow sneak path 372 through row switch 366b, node 346d, heating element 306d of unselected cell 330d, floating second terminal 325d of heating element 306d, floating second terminal 325a of heating element 306a, through heating element 306a of unselected cell 330a, node 346a, node 346b, through heating element 306b of unselected cell 330b, out of grounded second terminal 325b of heating element 306b, and through ground connection switch 368b to ground 348. Thus, in addition to intended path 370 through selected cell 330e, sneak path 372 passes a portion of amorphizing or crystallizing pulse 340 through unselected cells 330d. 330a, and 330b, thereby resulting in significant increase in DC power consumption during actuation.

It is noted that, in addition to, or as an alternative to sneak path 372, other sneak paths through array 360 are possible for the specific pulse and ground connections shown in FIG. 3. For example, other sneak paths may include diversion of a portion of amorphizing or crystallizing pulse 340 through one or both of unselected cells 330g and 330h.

Figure 4:
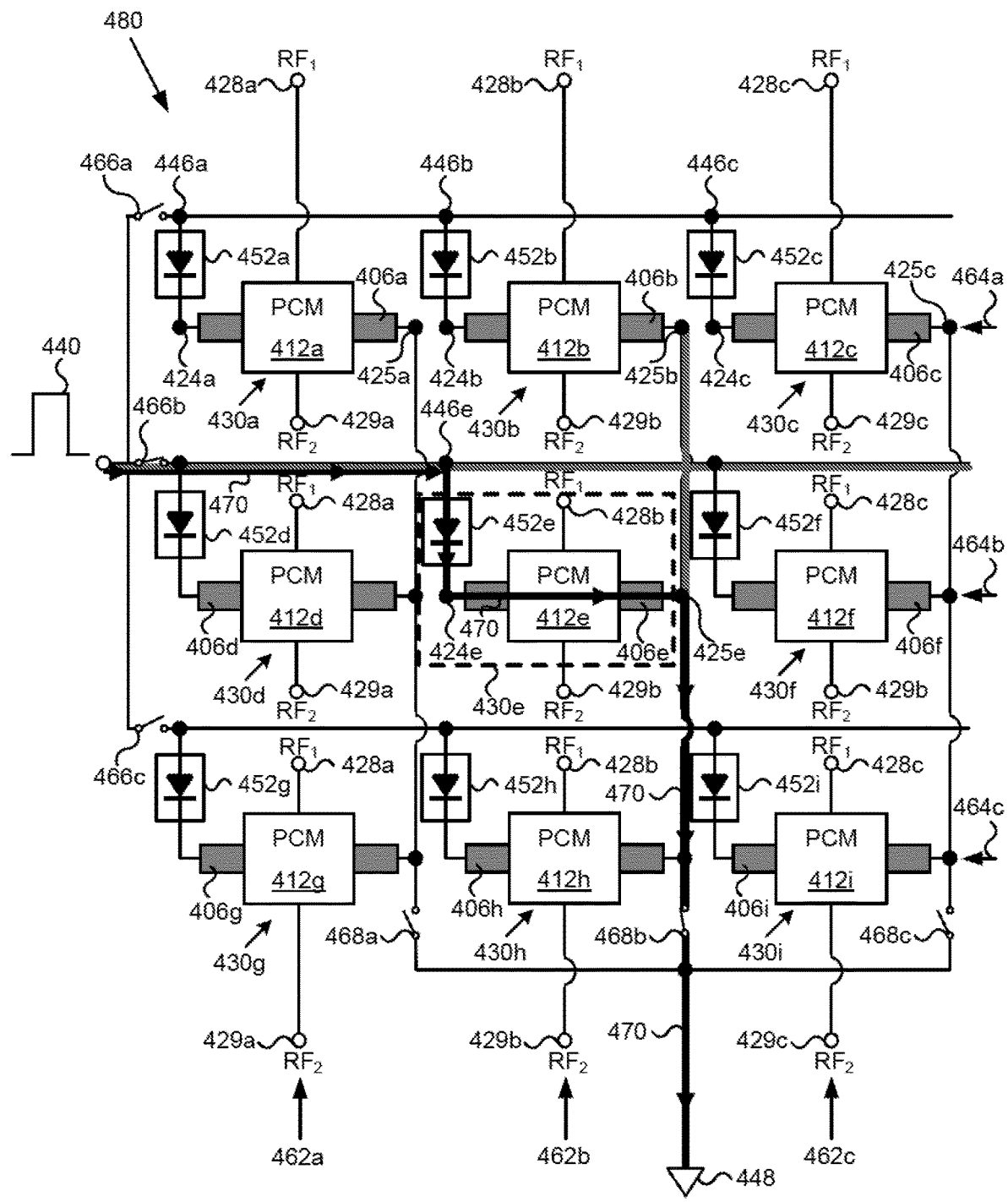
FIG. 4 shows an array of PCM switching cells each including a non-linear device, such as a diode, that substantially prevents the sneak paths provided by the array shown in FIG. 3, according to one implementation of the present application.

FIG. 4 shows array 480 of PCM switching cells each including a non-linear device, such as a diode, that substantially prevents the sneak paths provided by the array shown in FIG. 3, according to one implementation of the present application. As shown in FIG. 4, array 480 includes multiple columns 462a, 462b, and 462c, and multiple rows 464a, 464b, and 464c of cells 430a, 430b, 430c, 430d, 430e, 430f, 430g, 430h, and 430i (hereinafter "cells 430a-430i").

As further shown in FIG. 4, each of cells 430a-430i includes a PCM configured to be programmed by amorphizing pulse or crystalizing pulse 440, and further includes a corresponding heating element. As examples, cell 430a includes PCM 412a and heating element 406a, cell 430b includes PCM 412b and heating element 406b, cell 430c includes PCM 412c and heating element 406c, and so forth. In addition, each of cells 430a-430i includes a respective pair of RF terminals. That is to say, cell 430a has RF terminals 428a and 429a, cell 430b has RF terminals 428b and 429b, cell 430c has RF terminals 428c and 429c, and so forth.

According to the exemplary implementation shown in FIG. 4, each of cells 430a-430i also includes a corresponding non-linear device coupled to a first terminal of its respective heating element (the non-linear device shown as an exemplary diode in FIG. 4). Thus, cell 430a includes non-linear device 452a shown as a diode having its cathode coupled to first terminal 424a of heating element 406a, cell 430b includes non-linear device 452b shown as a diode having its cathode coupled to first terminal 424b of heating element 406b, cell 430c includes non-linear device 452c shown as a diode having its cathode coupled to first terminal 424c of heating element 406c, and so forth.

Each of cells 430a-430i also includes an input node to its corresponding non-linear device and a second terminal of its respective heating element configured for selective coupling to ground. That is to say, cell 430a includes input node 446a coupled to the input of non-linear device 452a (shown as the anode of exemplary diode 452a), as well as second terminal 425a of heating element 406a, cell 430b includes input node 446b coupled to the input of non-linear device 452b (shown as the anode of exemplary diode 452b), as well as second terminal 425b of heating element 406b, cell 430c includes input node 446a coupled to the input of non-linear device 452c (shown as the anode of exemplary diode 452c), as well as and second terminal 425c of heating element 406c, and so forth.

FIG. 4 further shows row switches 466a, 466b, and 466c for providing amorphizing or crystallizing pulse 440 to a selected cell of array 480, as well as ground connection switches 468a, 468b, and 468c for coupling the second terminal of the heating element of the selected cell to DC ground 448. Also shown in FIG. 4 is intended path 470 for amorphizing or crystallizing pulse 440.

According to the exemplary implementation shown in FIG. 4, each of cells 430a-430i corresponds in general to PCM RF switch 130/230, in FIGS. 1A, 1B, 1C, and 2, and may share any of the characteristics attributed to that corresponding feature above. That is to say, although not shown in FIG. 4, each of cells 430a-430i may include any of the features shown by FIGS. 1B and 1C, and described by reference to those figures above. Thus, as in FIG. 1B, PCM 412a of cell 430a overlies and is transverse to heating element 406a, PCM 412b of cell 430b overlies and is transverse to heating element 406b, PCM 412c of cell 430c overlies and is transverse to heating element 406c, and so forth. In addition, and also as in FIG. 1B, RF terminals 428a and 429a are coupled to PCM contacts 118 that are in turn electrically connected to opposing sides of PCM 412a, RF terminals 428b and 429b are coupled to PCM contacts 118 that are electrically connected to opposing sides of PCM 412b, RF terminals 428c and 429c are coupled to PCM contacts 118 that are electrically connected to opposing sides of PCM 412c, and so forth.

It is further noted that cell 430e is framed by a dashed line to indicate that cell 430e including PCM 412e, heating element 406e, RF terminals 428e and 429e, and non-linear device 452e is the cell of array 480 selected to receive amorphizing or crystallizing pulse 440. It is also noted that although FIG. 4 shows array 480 to include three columns and three rows providing nine cells, that representation is provided merely for ease of description of the present inventive concepts. In other implementations, array 480 may include more or many more than three rows and three columns, and may have many more than nine cells.

In the exemplary implementation shown in FIG. 4, row switch 466b and ground connection switch 468b are closed, while row switches 466a, 466c, and ground connection switches 468a and 468c are open. As a result, intended path 470 for amorphizing or crystallizing pulse 440 is through row switch 466b, through input node 446e and non-linear device 452e into first terminal 424e of heating element 406e, out of grounded second terminal 425e of heating element 406e, and through ground connection switch 468b to ground 448. Moreover, despite the second terminals of the respective heating elements of cells 430d and 430a being floating by virtue of ground connection switch 468a being open, the sneak paths available in array 360 for partial diversion of amorphizing or crystallizing pulse 340 are advantageously not available in array 480 for amorphizing or crystallizing pulse 440.

For example, when implemented as a diode, as shown in FIG. 4, each of non-linear devices 452a, 452b, 452c, 452d, 452e, 452f, 452g, 452h, and 452i (hereinafter non-linear devices 452a-452i") provides a low impedance path into its respective cell, but presents a high impedance path from the first terminal of a corresponding heating element of the cell to the input node of the cell. That is to say, non-linear device 452a provides a low impedance path from input node 446a to first terminal 424a of heating element 406a but presents a high impedance path from first terminal 424a to input node 446a, non-linear device 452b provides a low impedance path from input node 446b to first terminal 424b of heating element 406b but presents a high impedance path from first terminal 424b to input node 446b non-linear device 452c provides a low impedance path from input node 446c to first terminal 424c of heating element 406c but presents a high impedance path from first terminal 424c to input node 446c, and so forth.

Thus, non-linear devices 452a-452i serve effectively as check valves for preventing current flow from the first terminal of a heating element of a cell to the input node for that cell. It is noted that although in some implementations, as shown in FIG. 4, each of non-linear devices 452a-452i may take the form of a diode, that representation is merely exemplary. In other implementations, non-linear devices 452a-452i may take the form of any other circuit elements having suitable non-linear I-V characteristics. For example, in other implementations, non-linear devices 452a-452i may be implemented using diode-configured transistors, ovonic threshold switching devices, or resistive memory elements, to name a few alternatives.

Thus, according to the implementation shown in FIG. 4, each of cells 430a-430i is configured to be selectively coupled to amorphizing or crystallizing pulse 440 at a selected row, where the non-linear device of the cell allows amorphizing or crystallizing pulse 440 to pass to the first terminal of the heating element of the cell. In addition, each of cells 430a-430i is configured to be selectively coupled to ground 448 at a selected column, where ground 448 is provided to a second terminal of the heating element of the cell. Moreover, each of cells 430a-430i is configured to be a selected cell when having both the selected row and the selected column, while the respective non-linear device in each of cells 430a-430i is configured to substantially prevent a sneak path for amorphizing or crystallizing pulse 440 from being provided to an unselected cell in array 480. As a result, novel use of non-linear devices 452a-452i in array 480, as shown in FIG. 4, significantly reduces DC power consumption during actuation, while also advantageously preventing unselected cells of array 480 from being subjected to programming pulses.

Thus, various implementations of the present application disclose novel solutions for both preventing interference with RF signals at the RF terminals of PCM RF switches and also for preventing DC power loss and inadvertent programming of unselected PCM cells by blocking sneak paths. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A circuit comprising:
a diode coupled to a heating element of a phase-change material (PCM) radio frequency (RF) switch;
said diode configured to allow an amorphizing pulse or a crystalizing pulse to pass to a first terminal of said heating element;
said diode configured to substantially prevent a pulse generator configured to provide said amorphizing pulse or said crystalizing pulse from interfering with RF signals at RF terminals of said PCM RF switch.

2. The circuit of claim 1, wherein an anode of said diode is coupled to said pulse generator, and a cathode of said diode is coupled to said first terminal of said heating element.

3. The circuit of claim 1, wherein said pulse generator presents a variable impedance to said RF terminals.

4. The circuit of claim 1, wherein a second terminal of said heating element is coupled to ground.

5. The circuit of claim 1, wherein said PCM RF switch comprises a PCM overlying and transverse to said heating element.

6. The circuit of claim 5, wherein said RF terminals are coupled to PCM contacts that are electrically connected to opposing sides of said PCM.

7. The circuit of claim 1, wherein said PCM RF switch comprises a plurality of parasitic capacitors coupling said RF terminals to said first terminal of said heating element.

8. The circuit of claim 7, wherein said diode is configured to substantially prevent RF current from said RF terminals to flow through said plurality of parasitic capacitors to said pulse generator.

9. A circuit comprising:
a non-linear device coupled to a heating element of a phase-change material (PCM) radio frequency (RF) switch;
said non-linear device configured to allow an amorphizing pulse or a crystalizing pulse to pass to a first terminal of said heating element of said PCM RF switch;
said non-linear device configured to substantially prevent a pulse generator providing said amorphizing pulse or said crystalizing pulse from interfering with RF signals at RF terminals of said PCM RF switch.

10. The circuit of claim 9, wherein said non-linear device is configured to pass current from said pulse generator to said first terminal of said heating element, while substantially preventing RF current to flow from said RF terminals to said pulse generator.

11. The circuit of claim 10, wherein said non-linear device is selected from the group consisting of a diode, a diode-configured transistor, an ovonic threshold switching device, and a resistive memory element.

12. The circuit of claim 9, wherein said PCM RF switch comprises a plurality of parasitic capacitors coupling said RF terminals to said first terminal of said heating element.

13. An array comprising a plurality of columns and a plurality of rows of cells, said array comprising:
each of said cells including a phase-change material (PCM) configured to be programmed by an amorphizing pulse or a crystallizing pulse, each of said cells further including a corresponding heating element and a corresponding diode;
each of said cells configured to be selectively coupled to said amorphizing pulse or said crystallizing pulse at a selected row, wherein said corresponding diode allows said amorphizing pulse or said crystallizing pulse to pass to a first terminal of said corresponding heating element;
each of said cells configured to be selectively coupled to ground at a selected column, wherein said ground is provided to a second terminal of said corresponding heating element;
each of said cells being configured to be a selected cell when having both said selected row and said selected column;
said corresponding diode in each of said cells being configured to substantially prevent a sneak path for said amorphizing pulse or said crystallizing pulse from being provided to an unselected cell in said array.

14. The array of claim 13, wherein a cathode of said corresponding diode is coupled to said first terminal of said corresponding heating element.

15. The array of claim 13, wherein said PCM overlies and is transverse to said corresponding heating element.

16. The array of claim 13, wherein radio frequency (RF) terminals are coupled to PCM contacts that are electrically connected to opposing sides of said PCM.

17. The array of claim 13, wherein radio frequency (RF) terminals are coupled to PCM contacts that are electrically connected to opposing sides of said PCM.

18. An array comprising a plurality of columns and a plurality of rows of cells, said array comprising:
- each of said cells including a phase-change material (PCM) configured to be programmed by an amorphizing pulse or a crystallizing pulse, each of said cells further including a corresponding heating element and a corresponding non-linear device;
- each of said cells configured to be selectively coupled to said amorphizing pulse or said crystallizing pulse at a selected row, wherein said corresponding non-linear device allows said amorphizing pulse or said crystallizing pulse to pass to a first terminal of said corresponding heating element;
- each of said cells configured to be selectively coupled to ground at a selected column, wherein said ground is provided to a second terminal of said corresponding heating element;
- each of said cells being configured to be a selected cell when having both said selected row and said selected column;
- said corresponding non-linear device in each of said cells being configured to substantially prevent a sneak path for said amorphizing pulse or said crystallizing pulse from being provided to an unselected cell in said array.

19. The array of claim 18, wherein said corresponding non-linear device is selected from the group consisting of a diode, a diode-configured transistor, an ovonic threshold switching device, and a resistive memory element.

20. The array of claim 18, wherein said PCM overlies and is transverse to said corresponding heating element.

\* \* \* \* \*